United States Patent
Choi et al.

(10) Patent No.: US 6,988,042 B2
(45) Date of Patent: *Jan. 17, 2006

(54) METHOD FOR DETECTING LINE-TO-LINE FAULT LOCATION IN POWER NETWORK

(75) Inventors: Myoen-Song Choi, Seoul (KR); Seung-Jae Lee, Seongnam-si (KR)

(73) Assignee: Myongji University, Seoul (KR)

( * ) Notice: Subject to any disclaimer, the term of this patent is extended or adjusted under 35 U.S.C. 154(b) by 34 days.

This patent is subject to a terminal disclaimer.

(21) Appl. No.: 10/722,089

(22) Filed: Nov. 25, 2003

(65) Prior Publication Data

US 2005/0114048 A1  May 26, 2005

(51) Int. Cl.
   *G01R 31/00*  (2006.01)
   *G01R 31/14*  (2006.01)

(52) U.S. Cl. .......................... 702/59; 324/509
(58) Field of Classification Search ................ 702/59; 324/509, 525, 519, 521, 522
See application file for complete search history.

(56) References Cited

U.S. PATENT DOCUMENTS

| | | | |
|---|---|---|---|
| 4,719,580 A * | 1/1988 | Nimmersjo | 702/59 |
| 5,010,544 A * | 4/1991 | Chang et al. | 370/243 |
| 5,072,403 A * | 12/1991 | Johns | 702/59 |
| 5,198,746 A * | 3/1993 | Gyugyi et al. | 323/207 |
| 6,476,613 B2 * | 11/2002 | Saha et al. | 324/522 |
| 6,601,001 B1 * | 7/2003 | Moore | 702/59 |
| 6,756,786 B2 * | 6/2004 | Choi et al. | 324/509 |
| 2003/0155929 A1 | 8/2003 | Choi et al. | |

OTHER PUBLICATIONS

Chen et al., A Fault Location Algorithm for Transmission Line Based on Distributed Parameter, IEEE 2001, Develop. in Power System Protection, Conf. Pub. No. 479, pp. 411-413.*

Stamp et al., Fault Location Technique for Six Phase Transmission Lines With Unsynchronised Phasors, IEEE 1999, pp. 663-667.*

* cited by examiner

*Primary Examiner*—Bryan Bui
*Assistant Examiner*—Toan M. Le
(74) *Attorney, Agent, or Firm*—The Webb Law Firm

(57) ABSTRACT

The present invention relates to a method for detecting a line-to-line fault location in power network, and more particularly, detecting the line-to-line fault location by direct 3-phase circuit analysis without using a symmetrical component transformation, so even in an unbalanced 3-phase circuit, the line-to-line fault location can be accurately detected. In the method using direct 3-phase circuit analysis of this invention, inverse lemma is used to simplify matrix inversion calculations, thus the line-to-line fault location can be easily and accurately determined even in the case of an unbalanced network without symmetrical component transformation.

4 Claims, 5 Drawing Sheets

METHOD FOR DETECTING LINE-TO-LINE FAULT LOCATION IN POWER NETWORK

BACKGROUND OF THE INVENTION (a) Field of the Invention

The present invention relates to a method for detecting a line-to-line fault location in power network, and more particularly, detecting the line-to-line fault location with direct 3-phase circuit analysis without using a symmetrical component transformation, whereby even in an unbalanced 3-phase circuit the line-to-line fault location can be accurately detected.

(b) Description of the Related Art

Rapid growth of economy has resulted in large scale of power systems, and an excessive increase in transmission and distribution networks of electric power systems causes many kinds of faults by various causes. Transmission and distribution networks of electric power systems are playing very important roles as the links between the power suppliers and the consumers. However, because most of lines are exposed to air, lightning, contact of animals or mal-functioning of protection devices causes many kinds of faults. When a line-to-line fault occurs, detecting a fault location rapidly and precisely separating the part of the network including the fault location from the rest part of the network until repairing the fault being finished is very important to minimize power interruption rate and to provide highly reliable power supplying service and electric power of high quality.

Transformation of 3-phase networks to symmetrical component systems (symmetrical component transformation) is generally used in conventional methods for detecting the line-to-line fault locations. A 3-phase balanced network can be transformed to a symmetrical component system, which has no coupling between sequences so that the systems of equation may be solved easily. In other words, diagonal sequence impedance matrices are obtained in case of the balanced networks, thus sequence voltage and current can be expressed without any coupling among the sequences.

The advantage of the above method is that it can be easily applied to a balanced network. Zero sequence, positive sequence and negative sequence can be easily analyzed because they are not correlated, that is, there is no couplings, or equivalently, mutual impedances among the sequences.

However, the above conventional method can only be applied to a balanced network, because the simplified equations of zero sequence, positive sequence and negative sequence, which are not correlated, can be obtained by symmetrical component transformation only in the balanced network. Thus, the conventional method is not available for unbalanced systems.

SUMMARY OF THE INVENTION

The present invention has been made in an effort to solve the above problems.

It is an object of the present invention to provide a method for detecting a line-to-line fault location in a power network including a fault resistance, not using the symmetrical component transformation but using direct 3-phase circuit analysis. The line-to-line fault location detecting method of the present invention requires phase voltage and phase current of a fundamental frequency measured at a relay.

In the method using direct 3-phase circuit analysis of the present invention, matrix inverse lemma is applied to simplify matrix inversion calculations, thus the line-to-line fault location can be easily and accurately determined even in the case of an unbalanced network without using the symmetrical component transformation.

By using the method of the present invention, the line-to-line fault location can be directly analyzed whether the 3-phase network is balanced or unbalanced.

To achieve the above object, the present invention provides a method for detecting a line-to-line fault location in a power network comprising the steps of:

determining elements of a line impedance matrix and a load impedance matrix, and phase voltages and currents at a relay;

determining a line-to-line fault distance d by substituting said elements of said line impedance matrix and said load impedance matrix, and said phase voltage and current into a fault location equation based on direct circuit analysis;

wherein said fault location equation is derived from a model consisting of said phase voltage and current at the relay, a fault current, a fault resistance and the line-to-line fault distance;

wherein the model is based on the line-to-line fault between a-phase and b-phase and described by a model equation:

$$V_{Sa} - V_{Sb} = (1-d)((Zl_{aa} - Zl_{ba})I_{Sa} + (Zl_{ab} - Zl_{bb})I_{Sb} + (Zl_{ac} - Zl_{cb})I_{Sc}) + I_f R_f,$$

where, $V_{Sabc} = [V_{Sa}\ V_{Sb}\ V_{Sc}]'$: phase voltage vector, $I_{Sabc} = [I_{Sa}\ I_{Sb}\ I_{Sc}]'$: phase current vector, $$Zl_{abc} = \begin{bmatrix} Zl_{aa} & Zl_{ab} & Zl_{ac} \\ Zl_{ba} & Zl_{bb} & Zl_{bc} \\ Zl_{ca} & Zl_{cb} & Zl_{cc} \end{bmatrix};$$

line impedance matrix, $I_f$: fault current, 1−d: fault distance;

wherein said fault location equation is derived by using the matrix inverse lemma: $(A^{-1} + BCD)^{-1} = A - AB(C^{-1} + DAB)^{-1}DA$, to simplify an inverse matrix calculation; and wherein the fault location equation is derived by direct circuit analysis without using the conventional symmetrical component transformation method.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiment of the present invention will now be described in detail, with reference to the accompanying drawings.

Figure 1:
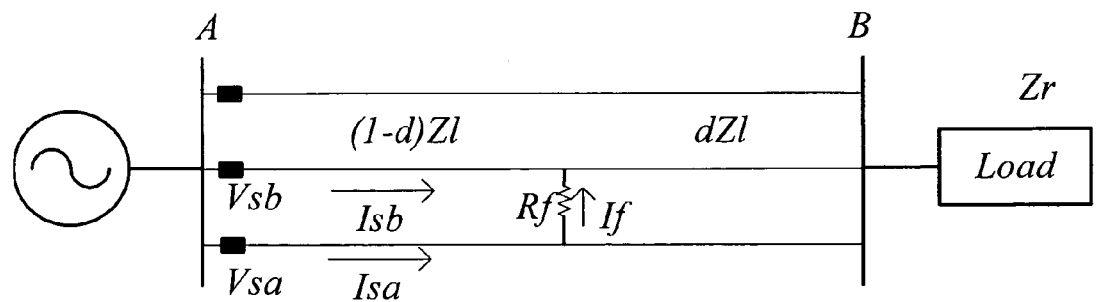
FIG. 1 shows a simple diagram of a line-to-line fault occurred in a general 3-phase power network whether it is balanced or unbalanced one.

FIG. 1 shows general 3-phase transmission and distribution of simplified diagram of faulted network whether they are operated in a balance or unbalance manner. The proposed algorithm use voltages and currents measured at a relay.

Based on a model shown in FIG. 1 and assuming the capacitance of lines negligible, phase voltages and phase currents at the location of relay A satisfy the following model equation.

$$V_{Sa} - V_{Sb} = (1-d)((Zl_{aa} - Zl_{ba})I_{sb} + (Zl_{ac} - Zl_{bb})I_{sb} + (Zl_{ac} - Zl_{cb})) + I_f R_f \quad (1)$$

Where, $V_{Sa}$ and $V_{Sb}$ are phase voltages of a-phase and b-phase respectively, and $I_{Sa}$, $I_{Sb}$ and $I_{Sc}$ are phase currents of a-phase, b-phase and c-phase respectively at the relay A, $I_{Sabc} = [I_{Sa}\ I_{Sb}\ I_{Sc}]'$ is a phase current vector at the relay A, $$Zl_{abc} = \begin{bmatrix} Zl_{aa} & Zl_{ab} & Zl_{ac} \\ Zl_{ba} & Zl_{bb} & Zl_{bc} \\ Zl_{ca} & Zl_{cb} & Zl_{cc} \end{bmatrix}$$

represents a line impedance matrix, $I_f$ represents a fault current, $R_f$ is a fault resistance, d is a fault distance.

In equation (1), the line impedance is given, and the phase voltages and currents at relay can be measured. However, the fault current $I_f$ and fault resistance $R_f$ are unknown. They can be obtained using the direct 3-phase circuit analysis of this invention as described below.

The fault current $I_f$ can be represented as a function of the phase currents at the relay using current distribution law of a parallel admittance network:

$$\begin{bmatrix} I_f \\ 0 \\ 0 \end{bmatrix} = Y_f [Y_f + (dZl_{abc} + Zr_{abc})^{-1}]^{-1} \begin{bmatrix} I_{Sa} \\ I_{Sb} \\ I_{Sc} \end{bmatrix} \quad (2)$$

where, $$Y_f = \begin{bmatrix} 1/R_f & -1/R_f & 0 \\ -1/R_f & 1/R_f & 0 \\ 0 & 0 & 0 \end{bmatrix};$$

the fault admittance matrix at the fault location; and $$Zr_{abc} = \begin{bmatrix} Zr_{aa} & Zr_{ab} & Zr_{ac} \\ Zr_{ba} & Zr_{bb} & Zr_{bc} \\ Zr_{ca} & Zr_{cb} & Zr_{cc} \end{bmatrix};$$

the load impedance matrix.

The inverse matrix $[Y_f + (dZl_{abc} + Zr_{abc})^{-1}]^{-1}$ in Eq. (2) can be simplified by the matrix inverse lemma:

$$(A^{-1} + BCD)^{-1} = A - AB(C^{-1} + DAB)^{-1}DA \quad (3)$$

A, B, C and D are defined as follows:

$$A \equiv (dZl + Zr) = \begin{bmatrix} a_{11} & a_{12} & a_{13} \\ a_{21} & a_{22} & a_{23} \\ a_{31} & a_{32} & a_{33} \end{bmatrix} \quad (4)$$

$$B \equiv \begin{bmatrix} 1 \\ -1 \\ 0 \end{bmatrix}, \quad (5)$$

$$C \equiv 1/R_f,$$

$$D \equiv [1\ -1\ 0]$$

Then, applying the lemma, we obtain:

$$[Y_f + (dZl + Zr)^{-1}Zr)^{-1}]^{-1} = \begin{bmatrix} a_{11} & a_{12} & a_{13} \\ a_{21} & a_{22} & a_{23} \\ a_{31} & a_{32} & a_{33} \end{bmatrix} - \begin{bmatrix} a_{11} - a_{12} \\ a_{21} - a_{22} \\ a_{31} - a_{32} \end{bmatrix} \quad (6)$$

$$(R_f + a_{11} + a_{22} - a_{12} - a_{21})^{-1}[a_{11} - a_{21}\ a_{12} - a_{22}\ a_{13} - a_{23}] = \begin{bmatrix} a_{11} & a_{12} & a_{13} \\ a_{21} & a_{22} & a_{23} \\ a_{31} & a_{32} & a_{33} \end{bmatrix} -$$

$$\frac{1}{(R_f + a_{11} + a_{22} - a_{12} - a_{21})} \times \begin{bmatrix} (a_{11} - a_{12})(a_{11} - a_{21}), & (a_{11} - a_{12})(a_{12} - a_{22}), & (a_{11} - a_{12})(a_{13} - a_{23}) \\ (a_{21} - a_{22})(a_{11} - a_{21}), & (a_{21} - a_{22})(a_{12} - a_{22}), & (a_{21} - a_{22})(a_{13} - a_{23}) \\ xx & xx & xx \end{bmatrix} =$$

$$\frac{1}{(R_f + a_{11} + a_{22} - a_{12} - a_{21})} \times \begin{bmatrix} (R_f a_{11} + a_{11} a_{22} - a_{12} a_{21}), & (R_f a_{12} + a_{11} a_{22} - a_{21} a_{12}), & (R_f a_{13} + a_{22} a_{13} - a_{21} a_{13} + a_{23} a_{11} - a_{23} a_{12}) \\ (R_f a_{21} + a_{11} a_{22} - a_{12} a_{21}), & (R_f + a_{11} a_{22} - a_{12} a_{21}), & (R_f a_{23} + a_{11} a_{23} - a_{12} a_{23} - a_{13} a_{21} + a_{13} a_{22}) \\ xx & xx & xx \end{bmatrix}$$

Then the fault current equation, Eq. (2) can be rewritten as:

$$\begin{bmatrix} I_f \\ 0 \\ 0 \end{bmatrix} = \frac{1}{(R_f + C_1 - C_2)} \begin{bmatrix} C_1 & C_2 & C_3 \\ xx & xx & xx \\ xx & xx & xx \end{bmatrix} \begin{bmatrix} I_{Sa} \\ I_{Sb} \\ I_{Sc} \end{bmatrix} \quad (7)$$

where, xx represents an element that we have no concern and other coefficients are as follows:

$C_1 = a_{11} - a_{21} = d(Zl_{aa} - Zl_{ba}) + Zr_{aa} - Zr_{ba} = dA_1 + B_1$, $C_2 = a_{12} - a_{22} = d(Zl_{ab} - Zl_{bb}) + Zr_{ab} - Zr_{bb} = dA_2 + B_2$ and $C_3 = a_{13} - a_{23} = d(Zl_{ac} - Zl_{bc}) + Zr_{ac} - Zr_{bc} = dA_3 + B_3$. (8)

Thus, the final expression for the fault current becomes:

$$I_f = \frac{C_1 I_{Sa} + C_2 I_{Sb} + C_3 I_{Sc}}{(R_f + C_1 - C_2)} \quad (9)$$

Substitution of Eq. (9) into the model equation of Eq. (1) and rearrangement can make a second order polynomial with respect to the distance variable d using expressions of the coefficients as in Eq. (8).

$$d^2(a_r + ja_i) + d(b_r + jb_i) + c_r + jc_i + R_f(d_r + jd_i) = 0 \quad (10)$$

where, $a_r + ja_i = (A_1 - A_2)D_1$, $b_r + jb_i = (A_1 - A_2)(V_{Sa} - V_{Sb} - D_1) + (B_1 - B_2)D_1$, $c_r + jc_i = (B_1 - B_2)(V_{Sa} - V_{Sb} - D_1)$, $d_r + jd_i = (V_{Sa} - V_{Sb} - D_1 - D_2)$, $D_1 = A_1 I_{Sa} + A_2 I_{Sb} + A_3 I_{Sc}$ and $D_2 = B_1 I_{Sa} + B_2 I_{Sb} + B_3 I_{Sc}$. (11)

From the imaginary part of Eq. (10), the following second order polynomial equation can be obtained.

$$d^2 \left( a_r - \frac{d_r}{d_i} a_i \right) + d \left( b_r - \frac{d_r}{d_i} b_i \right) + c_r - \frac{d_r}{d_i} c_i = 0 \quad (12)$$

Finally the fault distance d can be obtained by solving Eq. (12). Note that this fault location equation based on the direct circuit analysis can be applied to any system, which is balanced or unbalanced type, three phase or three/single phase systems.

Figure 2:
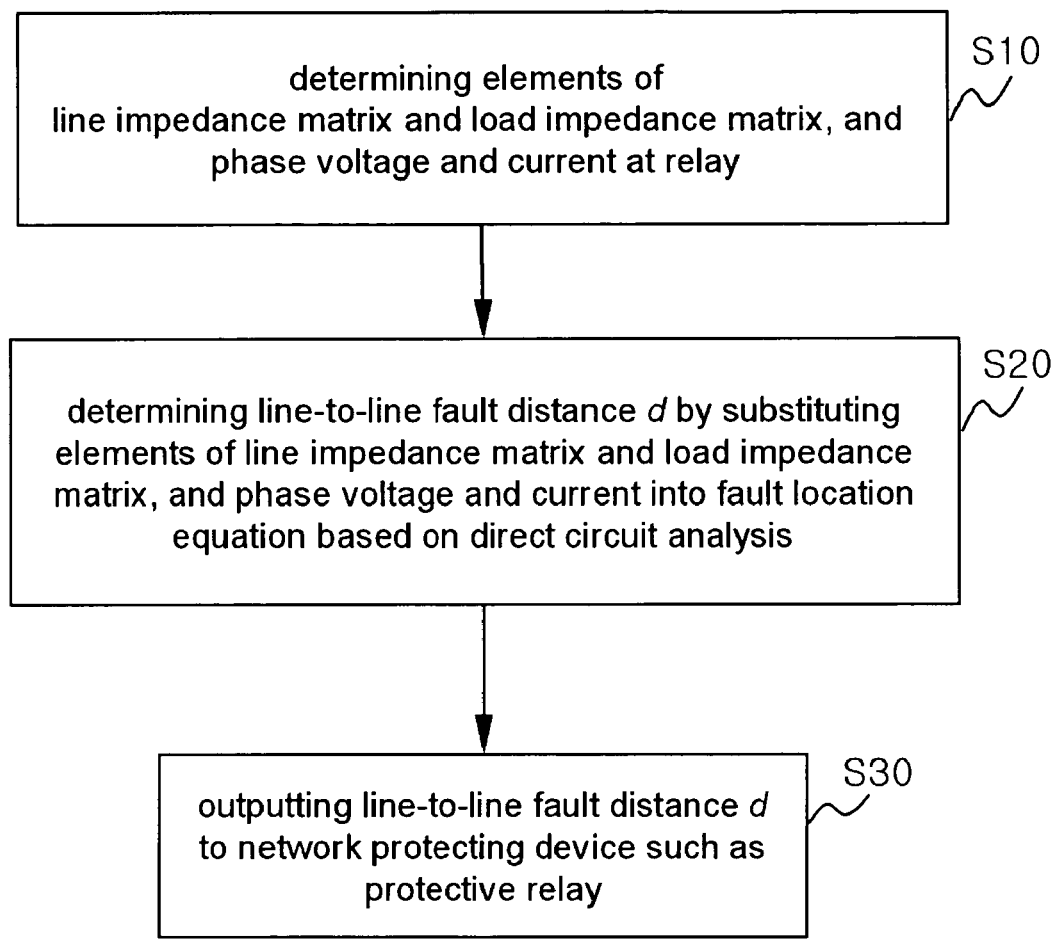
FIG. 2 shows a flow of a preferred embodiment of the present invention.

FIG. 2 shows a flow chart of the preferred embodiment of this invention.

The preferred embodiment shown in FIG. 2 comprises the steps of: determining elements of a line impedance matrix and a load impedance matrix, and phase voltages and currents at a relay (step S10); determining a line-to-line fault distance d by substituting said elements of said line impedance matrix and said load impedance matrix, and said phase voltages and currents into a fault location equation based on direct circuit analysis (step S20); and outputting the line-to-line fault distance d to the network protecting device such as protective relays (step S30).

Figure 3:
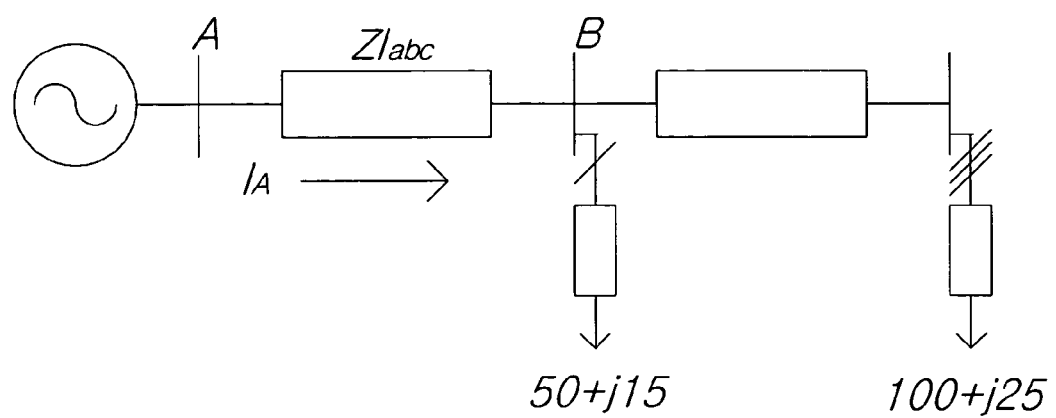
FIG. 3 shows an example of the unbalanced system where a line-to-line fault between a-phase and b-phase occurs.
Figure 4:
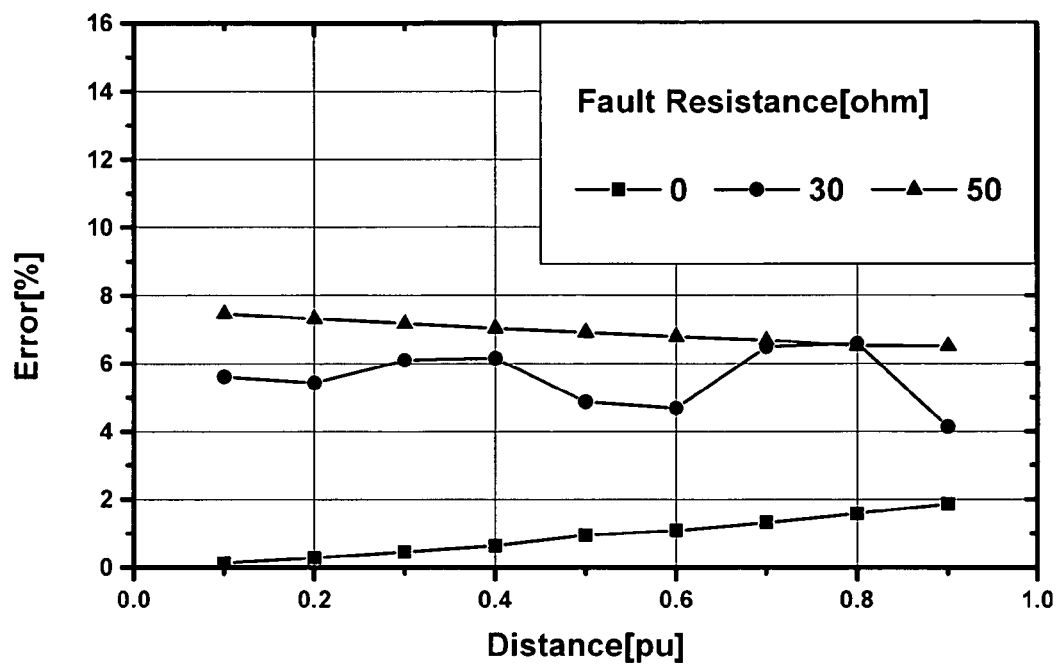
FIG. 4 shows errors resulted by using conventional method in case of line-to-line fault for the unbalanced system.
Figure 5:
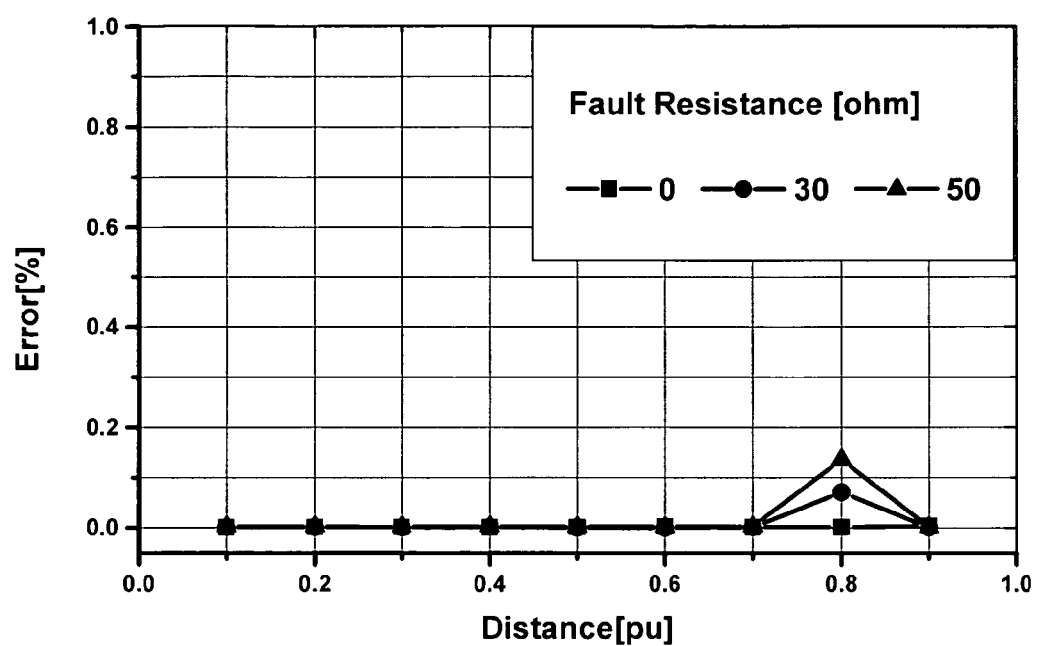
FIG. 5 shows errors resulted by using the proposed method in the same case as in FIG. 4.

The suggested method based on direct circuit analysis for the line-to-line fault has been also applied to the unbalanced system in FIG. 3 for verification. The line-to-line fault is assumed to have occurred between A and B. The results are compared with those of the conventional method using the distribution factor. FIG. 4 shows errors resulted by using the conventional method in case of line-to-line fault for the unbalanced system, while the FIG. 5 shows errors resulted by using the proposed method in the same case as in FIG. 4.

A significant accuracy difference can be observed between two results. The maximum estimation error is 8% in case of the conventional method while 0.15% in case of the proposed method. The error in the proposed method is very small showing its effectiveness for the real application.

A new fault location algorithms based on the direct circuit analysis are suggested. Application of the matrix inverse lemma has greatly simplified the derivation of the fault location equations that, otherwise, are too complicated to be derived. The proposed algorithms overcome the limit of the conventional fault location algorithms based on the sequence circuit analysis, which assumes the balanced system requirement. The proposed algorithms are applicable to any power system, but especially useful for the unbalanced distribution systems. Its effectiveness has been proved through many EMTP simulations. The objective of the embodiments and drawings is to clearly explain the present invention and does not limit the technical scope of the invention. The present invention described above can be replaced, modified and changed by one skilled in the art, as long as such changes do not exceed the technical scope of the invention. It is, therefore, to be understood that the appended claims are intended to cover all such modifications and changes as fall within the true spirit of the invention.

What is claimed is:

1. A method for detecting a line-to-line fault location in a power network comprising the steps of:
   determining elements of a line impedance matrix and a load impedance matrix, and phase voltages and currents at a relay;
   determining a line-to-line fault distance d by substituting said elements of said line impedance matrix and said load impedance matrix, and said phase voltage and current into a fault location equation based on direct circuit analysis;
   wherein said fault location equation is derived from a model consisting of said phase voltage and current at the relay, a fault current, a fault resistance and the line-to-line fault distance;
   wherein the model is based on the line-to-line fault between a-phase and b-phase and described by a model equation:

$V_{Sa} - V_{Sb} = (1-d)((Zl_{aa} - Zl_{ba})I_{Sa} + (Zl_{ab} - Zl_{bb})I_{Sb} + (Zl_{ac} - Zl_{cb})) + I_f R_f$, where, $V_{Sabc} = [V_{Sa}\ V_{Sb}\ V_{Sc}]'$: phase voltage vector, $I_{Sabc} = [I_{Sa}\ I_{Sb}\ I_{Sc}]'$: phase current vector, $$Zl_{abc} = \begin{bmatrix} Zl_{aa} & Zl_{ab} & Zl_{ac} \\ Zl_{ba} & Zl_{bb} & Zl_{bc} \\ Zl_{ca} & Zl_{cb} & Zl_{cc} \end{bmatrix}:$$

line impedance matrix, $I_f$: fault current, 1−d: fault distance;

wherein said fault location equation is derived by using the matrix inverse lemma: $(A^{-1}+BCD)^{-1}=A-AB(C^{-1}+DAB)^{-1}DA$, to simplify an inverse matrix calculation; and wherein the fault location equation is derived by direct circuit analysis without using the conventional symmetrical component transformation method.

2. The method of claim 1, wherein the power network is a 3-phase balanced network.

3. The method of claim 1, wherein the power network is a 3-phase unbalanced network.

4. The method of claim 1, wherein the fault location equation is derived by steps of:

(a) expressing the fault current If in terms of the phase current vector $I_s$ by using current distribution law of a parallel network yielding:

$$\begin{bmatrix} I_f \\ 0 \\ 0 \end{bmatrix} = Y_f[Y_f + (dZl_{abc} + Zr_{abc})^{-1}]^{-1} \begin{bmatrix} I_{Sa} \\ I_{Sb} \\ I_{Sc} \end{bmatrix},$$

where $Y_f = \begin{bmatrix} 1/R_f & -1/R_f & 0 \\ -1/R_f & 1/R_f & 0 \\ 0 & 0 & 0 \end{bmatrix}$:

fault admittance matrix and $$Zr_{abc} = \begin{bmatrix} Zr_{aa} & Zr_{ab} & Zr_{ac} \\ Zr_{ba} & Zr_{bb} & Zr_{bc} \\ Zr_{ca} & Zr_{cb} & Zr_{cc} \end{bmatrix}:$$

load impedance matrix;

(b) simplifying the equation of step (a) by using the inverse matrix lemma and substituting the simplified equation into the model equation;

(c) deriving a second order polynomial equation with respect to the line-to-line fault distance d from a real or an imaginary part of the equation obtained at step (b); and (d) deriving the fault location equation by solving the second order polynomial equation.

* * * * *

UNITED STATES PATENT AND TRADEMARK OFFICE
CERTIFICATE OF CORRECTION

PATENT NO. : 6,988,042 B2
DATED : January 17, 2006
INVENTOR(S) : Choi et al.

It is certified that error appears in the above-identified patent and that said Letters Patent is hereby corrected as shown below:

Column 7,
Line 17, "If" should read -- $I_f$ --.

Signed and Sealed this

Thirtieth Day of May, 2006

JON W. DUDAS
*Director of the United States Patent and Trademark Office*